(12) United States Patent
Jiang et al.

(10) Patent No.: US 7,233,471 B2
(45) Date of Patent: Jun. 19, 2007

(54) CIRCUIT OUTPUT STAGE PROTECTION SYSTEM

(75) Inventors: Xicheng Jiang, Irvine, CA (US); Ardie Venes, Laguna Niguel, CA (US)

(73) Assignee: Broadcom Corporation, Irvine, CA (US)

( * ) Notice: Subject to any disclaimer, the term of this patent is extended or adjusted under 35 U.S.C. 154(b) by 418 days.

(21) Appl. No.: 10/751,508

(22) Filed: Jan. 6, 2004

(65) Prior Publication Data
US 2005/0146819 A1 Jul. 7, 2005

(51) Int. Cl.
*H02H 3/20* (2006.01)
(52) U.S. Cl. .................................... 361/91.1
(58) Field of Classification Search ................ 361/56, 361/91.1; 326/80, 81
See application file for complete search history.

(56) References Cited
U.S. PATENT DOCUMENTS 5,420,527 A * 5/1995 Naber ..................... 326/32
5,821,799 A * 10/1998 Saripella .................. 327/333
6,384,685 B1 * 5/2002 Juang ...................... 330/264
6,891,433 B2 * 5/2005 Schrader .................. 330/253

* cited by examiner

*Primary Examiner*—Stephen W Jackson
*Assistant Examiner*—Boris Benenson
(74) *Attorney, Agent, or Firm*—Sterne, Kessler, Goldstein & Fox PLLC (57) ABSTRACT

An output stage protection system for protecting NMOS devices in an integrated circuit (IC) output stage during normal operations and power up/power down. In an embodiment, the output stage includes a pair of relatively low voltage NMOS devices coupled to a current source and IC core outputs. A first pair of relatively high voltage NMOS devices is coupled to the relatively low voltage pair and a biasing circuit. A second pair of relatively high voltage NMOS devices is coupled to a resistor, the first pair, and first and second output nodes, respectively. One or more diodes are coupled in series between the first and second output nodes and the resistor. In an embodiment, the output stage protection system protects NMOS devices in the output stage from electrostatic discharge (ESD). Input/output (I/O) pad ESD protection circuits are coupled to the I/O pads and include a clamp coupled to a local net.

20 Claims, 5 Drawing Sheets

CIRCUIT OUTPUT STAGE PROTECTION SYSTEM

BACKGROUND OF THE INVENTION

1. Field of the Invention

The present invention is related to NMOS-based integrated circuit (IC) output stages.

2. Related Art

As CMOS technology advances to the 0.1–0.2 µm range and beyond, supply voltages are scaled down accordingly. When voltage differences among the gate, source, and drain of a NMOS device exceed device ratings, the life of the device is significantly decreased. Therefore, a problem occurs when using NMOS devices in an IC output stage to interface relatively low supply voltage NMOS devices of an IC core circuit with relatively high supply voltage at the output stage.

In an example, the IC core circuit includes 0.13 µm NMOS devices that require a 1.2 V supply voltage, and the IC output stage requires a 3.3 V supply voltage. A level shifter coupled between the IC core circuit and output stage can be used to bridge the 1.2 V and 3.3 V power domains. But this approach is not advantageous because level shifters consume a significant amount of power, and combining 1.2 V IC core devices with 3.3 V output stage devices significantly increases processing cost.

What is needed, therefore, is a NMOS-based IC output stage to interface relatively low voltage NMOS devices in an IC core with relatively high voltages at the output stage, and more particularly, a system for protecting the NMOS devices in the IC output stage.

SUMMARY OF THE INVENTION

The present invention is directed to protecting NMOS devices in an IC output stage, which interfaces relatively low voltage NMOS devices in an IC core with relatively high voltages at the output stage. In an embodiment, the output stage protection system protects NMOS devices in the IC output stage during normal IC operations, IC power up/power down, and electrostatic discharge (ESD) events.

In an embodiment, the IC output stage includes a pair of relatively low voltage (e.g. 1.2 V thin oxide) NMOS devices, each having a gate coupled to an output of the IC core and a source coupled to a current source. The IC output stage further includes a first pair of relatively high voltage (e.g. 2.5 V thick oxide) NMOS devices, each having a source coupled to respective drains of the pair of 1.2 V NMOS devices. A biasing circuit biases the gates of the first pair of 2.5 V NMOS devices so that the voltage on the pair of 1.2 V NMOS devices does not exceed the voltage rating for 1.2 V NMOS devices. A second pair of relatively high voltage (e.g. 2.5 V thick oxide) NMOS devices each have a source coupled to respective drains of the first pair of 2.5 V NMOS devices and a drain coupled to a first output node and a second output node, respectively.

The IC output stage further includes one or more diodes coupled in series between the first output node and the gates of the second pair of 2.5 V NMOS devices, and one or more diodes coupled in series between the second output node and the gates of the second pair of 2.5 V NMOS devices. The series diodes substantially ensure that the first and second pairs of 2.5 V NMOS devices and the pair of 1.2 V NMOS devices operate within the device ratings during IC power up/power down. In another embodiment, the series diodes are coupled to the gates of the second pair of 2.5 V NMOS devices through a resistor. The series diodes, in conjunction with the resistor, provide added protection during ESD events at the output nodes.

In an embodiment, an output stage protection system protects NMOS devices in an IC output stage from ESD events at the input/output (I/O) pads. A first I/O pad ESD protection circuit is coupled to a first I/O pad and a second I/O pad ESD protection circuit is coupled to a second I/O pad. The first and second I/O pad ESD protection circuits include a clamp coupled to a local net as opposed to a chip-level supply voltage. The clamp redirects ESD to ground, away from the NMOS devices of the output stage.

In another embodiment, the IC output stage has a single-ended configuration. A relatively low voltage NMOS device is coupled to an IC core output and to a current source. A first relatively high voltage NMOS device is coupled to a biasing circuit and to the relatively low voltage NMOS device. A second relatively high voltage NMOS device is coupled to an output node and to the first relatively high voltage NMOS device. The single-ended IC output stage further includes one or more diodes coupled between the output node and a gate of the second relatively high voltage NMOS device. The one or more diodes substantially ensure that the first and second relatively high voltage NMOS devices and the relatively low voltage NMOS device operate within the device ratings during IC power up/power down. The one or more diodes are optionally coupled to the gate of the second relatively high voltage NMOS device through a resistor for added protection during ESD events at the output node.

Further features and advantages of the invention, as well as the structure and operation of various embodiments of the invention, are described in detail below with reference to accompanying drawings. It is noted that the invention is not limited to the specific embodiments described herein. Such embodiments are presented for illustrative purposes only. Additional embodiments will be apparent to persons skilled in the relevant arts based on the teachings contained herein.

BRIEF DESCRIPTION OF THE DRAWINGS/FIGURES

The present invention will be described with reference to the accompanying drawings. The drawing in which an element first appears is typically indicated by the leftmost digit(s) in the corresponding reference number.

DETAILED DESCRIPTION OF THE INVENTION

Overview

The present invention is directed to protecting NMOS devices in an IC output stage, which interfaces relatively low voltage NMOS devices in an IC core with relatively high output voltages at the output stage. In the detailed description that follows, the preferred embodiments of the present invention are presented in detail. While specific features, configurations, and devices are discussed in detail, this description is for illustrative purposes, and persons skilled in the art will recognize that other configurations and devices can be used to achieve the features of the present invention without departing from the scope and spirit thereof.

Example Output Stage System

Figure 1:
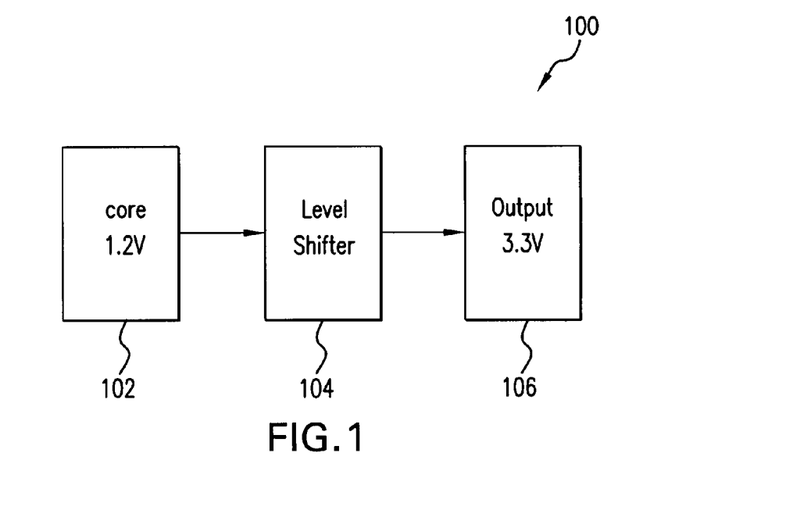
FIG. 1 illustrates a block diagram of a system for interfacing relatively low voltage devices in an IC core with relatively high voltage at an output stage.

FIG. 1 illustrates a block diagram of an example system 100 for interfacing relatively low voltage devices in an IC core with relatively high voltages at an output stage. In system 100, a level shifter 104 bridges a relatively low voltage core 102 with a relatively high voltage output 106. For exemplary purposes, the relatively low voltage core 102 is described herein as a 1.2 V core. The relatively high voltage output is described herein as a 3.3 V output. The invention is not, however, limited to these example voltages. Based on the description herein, one skilled in the relevant art(s) will understand that the invention can be implemented with other voltage levels.

Disadvantages of system 100 are level shifter 104 consumes a significant amount of power, and combining 1.2 V devices in IC core 102 with 3.3 V devices in output stage 106 significantly increases processing cost or are not available in the technology.

NMOS-Based Output Stage Protection System for Normal IC Operations

Figure 2:
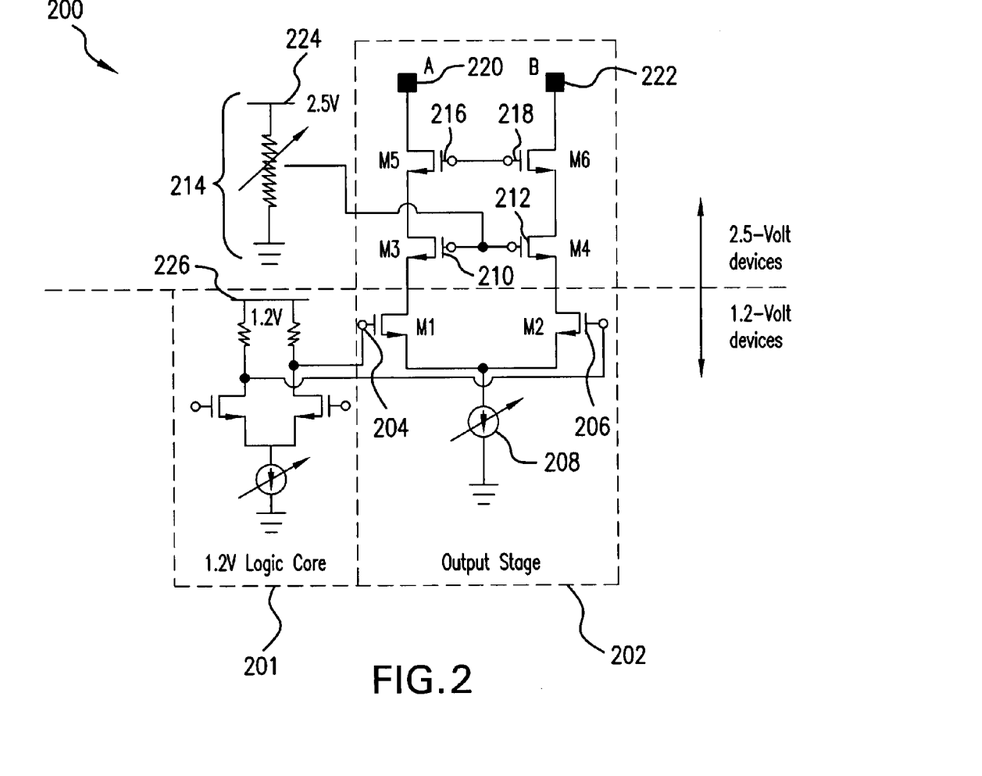
FIG. 2 illustrates a circuit diagram of an output stage protection system, which protects NMOS devices in an IC output stage during normal IC operations.

FIG. 2 illustrates a circuit diagram of a NMOS-based output stage protection system 200, which interfaces relatively low supply voltage NMOS devices in an IC logic core 201 with relatively high supply voltages at an output stage 202. Advantageously, NMOS-based output stage protection system 200 does not require a level shifter, such as level shifter 104, shown in FIG. 1. During normal IC operations, output stage protection system 200 of FIG. 2 protects 1.2 V NMOS main output stage devices and 2.5 V NMOS output stage protection devices in output stage 202.

In output stage 202, a pair of 1.2 V NMOS devices M1 204 and M2 206 each have a gate coupled to respective outputs of IC logic core 201, and a source coupled to a current source 208. A first pair of 2.5 V NMOS cascode devices M3 210 and M4 212 each have a source coupled to respective drains of 1.2 V pair M1 204 and M2 206. First pair M3 210 and M4 212 each have a gate coupled to an external biasing circuit 214, which biases first pair M3 210 and M4 212 so that 1.2 V pair M1 204 and M2 206 operate in the saturation region. External biasing circuit 214 biases the gates of first pair M3 210 and M4 212 such that a gate-source voltage difference at the drains of 1.2 V pair M1 204 and M2 206 does not exceed approximately 1.2 V. Methods and systems for implementing external biasing circuit 214 are well known to one skilled in the relevant art(s).

A second pair of 2.5 V NMOS cascode devices M5 216 and M6 218 each have a source coupled to respective drains of first pair M3 210 and M4 212. Gates of second pair M5 216 and M6 218 are coupled together and biased to approximately 2.5 V in order to bias first pair M3 210 and M4 212 in the saturation region. 2.5 V cascode device M5 216 has a drain coupled to an output node A 220, and 2.5 V cascode device M6 218 has a drain coupled to an output node B 222. In an embodiment, output nodes A 220 and B 222 are referenced to a 3.3 V external voltage supply through a resistive load.

In an embodiment, output stage protection system 200 has a single-ended configuration. A relatively low voltage NMOS device replaces pair of 1.2 V NMOS devices M1 204 and M2 206. A first relatively high voltage NMOS device replaces first pair of 2.5 V NMOS cascode devices M3 210 and M4 212, and a second relatively high voltage NMOS device replaces second pair of 2.5 V NMOS cascode devices M5 216 and M6 218.

Output stage protection system 200 ensures that during normal IC operations, first and second pairs of cascode devices M3 210–M6 218 and 1.2 V pair M1 204 and M2 206 operate in a relatively safe region, within the voltage ratings of the devices. For example, the voltage difference between any two of the three terminals (gate, source, and drain) of a 1.2 V NMOS device should not exceed approximately 1.32 V and the voltage difference between any two terminals of a 2.5 V NMOS device should not exceed approximately 2.75 V.

A problem occurs, however, during IC power up/power down when the NMOS device supply voltages are slowly ramping up or down. For example in FIG. 2, when 2.5 V supply voltage 224 and 1.2 V supply voltage 226 are slowly ramping up or down, and output nodes A 220 and B 222 are referenced to a 3.3 V external supply voltage, gate voltages of first and second pairs of cascode devices M3 210–M6 218 are approximately 0 V. Therefore, during IC power up/power down, the drain-source voltage difference between first and second pairs of cascode devices M3 210–M6 218 is about 3.3 V, which exceeds the 2.75 V voltage rating of the devices.

NMOS-Based Output Stage Protection during IC Power Up/Power Down

Figure 3:
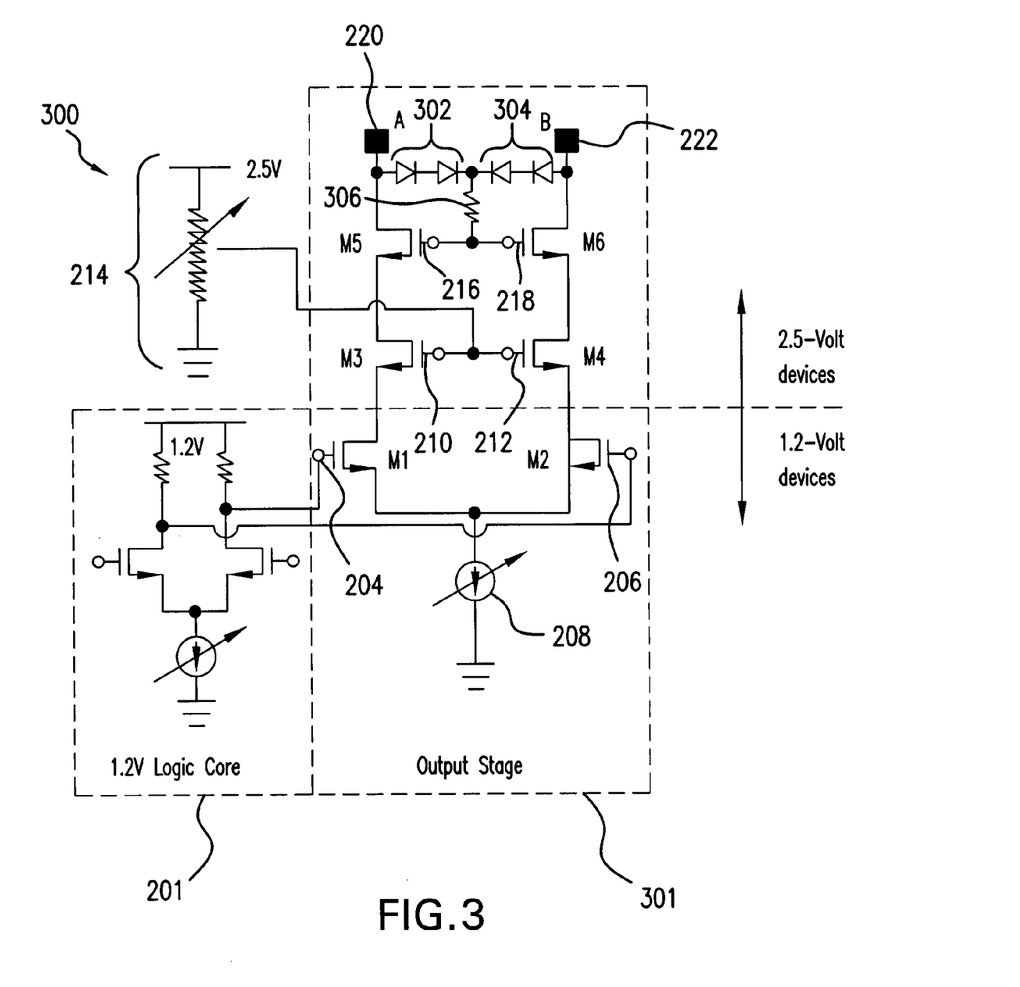
FIG. 3 illustrates a circuit diagram of an output stage protection system, in accordance with an embodiment of the present invention, which protects NMOS devices in an IC output stage during normal IC operations and IC power up/power down.

FIG. 3 illustrates a circuit diagram of a NMOS-based output stage protection system 300, in accordance with an embodiment of the present invention. Output stage protection system 300 interfaces relatively low supply voltage NMOS devices in IC logic core 201 with relatively high supply voltages in an output stage 301, and protects NMOS devices in output stage 301 during normal IC operations, as described in conjunction with FIG. 2 above.

Output stage protection system 300 differs from output stage protection system 200, shown in FIG. 2, in that the gates of second pair of cascode devices M5 216 and M6 218 in FIG. 3 are coupled to output pads A 220 and B 222 through series diodes. The series diodes are configured to protect NMOS devices in output stage 301 during IC power up/power down. In an embodiment, the gates of second pair of cascode devices M5 216 and M6 218 in FIG. 3 are coupled to output pads A 220 and B 222 through a resistor and series diodes. The resistor and series diodes are configured to protect NMOS devices in output stage 301 during IC power up/power down, as well as during ESD events on output nodes A 220 and B 222.

In FIG. 3, output stage 301 includes a first set of diodes 302 coupled between output node A 220 and a resistor R0

306, and a second set of diodes 304 coupled between output node B 222 and resistor R0 306. Resistor R0 306 is coupled between first and second sets of diodes 302 and 304 and the gates of second pair of cascode devices M5 216 and M6 218. In the example of FIG. 3, each set of diodes 302 and 304 includes a pair of diodes, for a total of four diodes. The number of diodes coupled in series between output nodes A 220 and B 222 can, however, be greater or fewer than four.

First and second sets of diodes 302 and 304 protect NMOS devices M1 204–M6 218 during IC power up/power down, and in conjunction with resistor R0 306, also protect NMOS devices M1 204–M6 218 during ESD events on output nodes A 220 and B 222. For example, the drain-gate voltage difference of a 2.5 V NMOS device should not exceed the device voltage rating of approximately 2.75 V. During IC power up/power down and during ESD events, the voltage on output nodes A 220 and B 222 may, at times, exceed 3.3 V, and the drain-gate voltage difference of second pair of cascode devices M5 216 and M6 218 may, at times, exceed 2.75 V.

In the example of FIG. 3, when the voltage on output nodes A 220 and B 222 exceeds 3.3 V, first and second pairs of diodes 302 and 304 are forward-biased. First and second pairs of diodes 302 and 304 pull up the gate voltage of second pair of cascode devices M5 216 and M6 218 so that the drain-gate voltage difference of the devices is below the device voltage rating of approximately 2.75 V. The source voltage of second pair of cascode devices M5 216 and M6 218 will also be pulled up so that the gate-source voltage difference of the devices is approximately equal to 2.75 V. During an ESD event on output nodes A 220 and B 222, resistor R0 306, in conjunction with first and second diode pairs 302 and 304, functions as a low-pass filter and further protects the gates of second pair of cascode devices M5 216 and M6 218.

In another embodiment, output stage 301 has a single-ended configuration. A relatively low voltage NMOS device replaces pair of 1.2 V NMOS devices M1 204 and M2 206. A first relatively high voltage NMOS device replaces first pair of 2.5 V NMOS cascode devices M3 210 and M4 212, and a second relatively high voltage NMOS device replaces second pair of 2.5 V NMOS cascode devices M5 216 and M6 218. A set of one or more diodes replaces first and second diode pairs 302 and 304. The set of one or more diodes is coupled between an output node and a gate of the second relatively high voltage NMOS device to protect the NMOS devices in output stage 301 during IC power up/power down. The set of one or more diodes is optionally coupled to the gate of the second relatively high voltage NMOS device through a resistor for added ESD protection.

Figure 4:
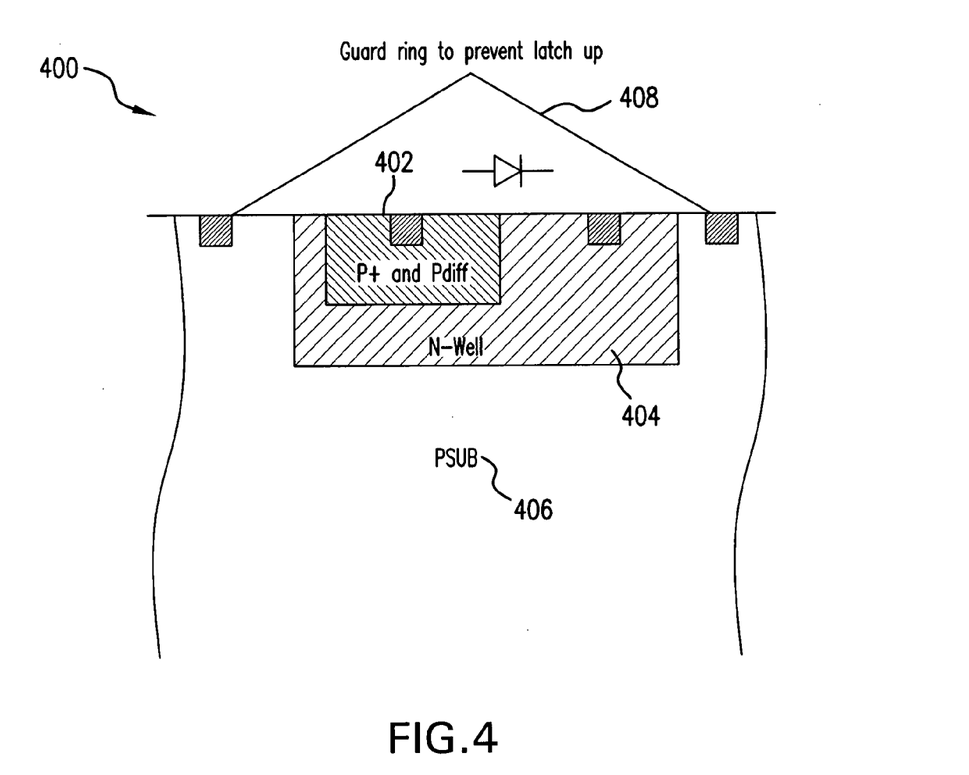
FIG. 4 illustrates an example NMOS diode implementation for the output stage protection system shown in FIG. 3.

FIG. 4 illustrates an example NMOS diode implementation for the diodes of first and second diode pairs 302 and 304, shown in FIG. 3. In the example of FIG. 4, a diode PN junction is implemented from a P+ area 402 and an N-Well area 404 of a PNP structure 400. A guard ring 408 surrounding PNP structure 400 is coupled to contacts on a P-substrate 406 in order to prevent latch up. Alternative diode structures can also be used to implement the diodes of first and second diode pairs 302 and 304.

I/O Pad Local ESD Protection System

Figure 5:
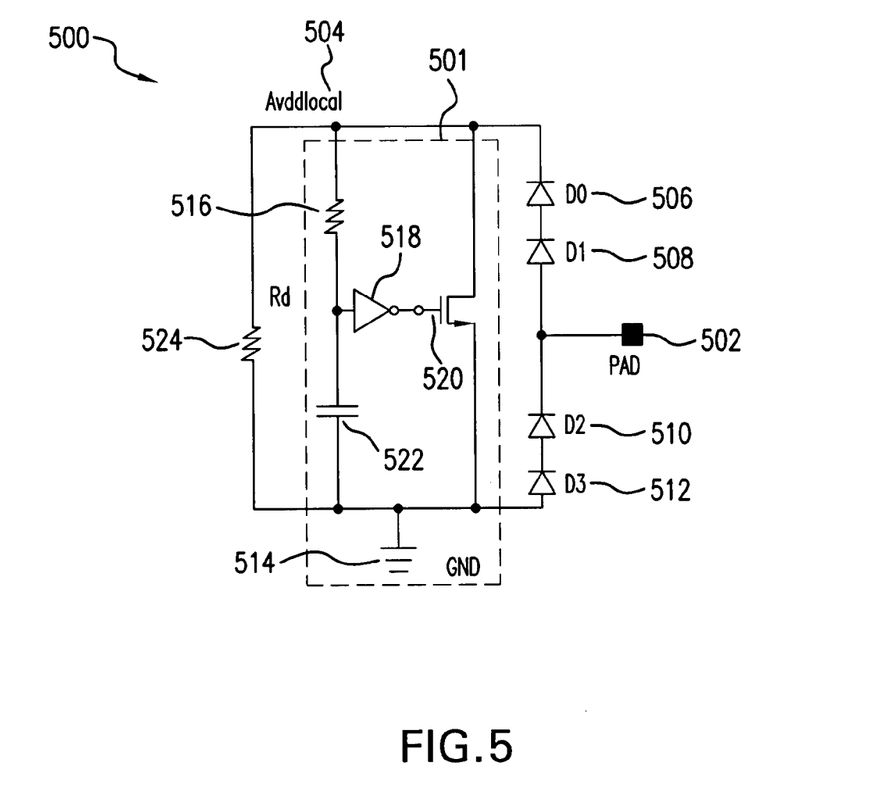
FIG. 5 illustrates an IC input/output (I/O) pad circuit, which provides local electrostatic discharge (ESD) protection, in accordance with an embodiment of the present invention.

FIG. 5 illustrates an input/output (I/O) pad ESD protection system 500, in accordance with an embodiment of the present invention, which provides local ESD protection at an I/O pad 502. I/O diode pairs D0 506 and D1 508 and D2 510 and D3 512 are coupled to a local net Avddlocal 504 and a separate ESD clamp 501, as opposed to a chip-level ESD protection circuit and power bus.

In FIG. 5, local net Avddlocal 504 is coupled to I/O pad 502 in parallel with clamp 501. Clamp 501 includes a resistor 516 coupled between local net Avddlocal 504 and an input of an inverter 518. A capacitor 522 is coupled between the input of inverter 518 and a ground 514. A NMOS device 520 has a gate coupled to an output of inverter 518, a drain coupled to local net Avddlocal 504, and a source coupled to ground 514. When an ESD event occurs on I/O pad 502, diode pair D0 506 and D1 508 are forward biased, and clamp 501 discharges ESD voltage to ground 514. A resistor Rd 524 ensures that local net Avddlocal 504 is less than approximately 2.75 V during normal operation in order to protect NMOS device 520 in clamp 501.

Figure 6:
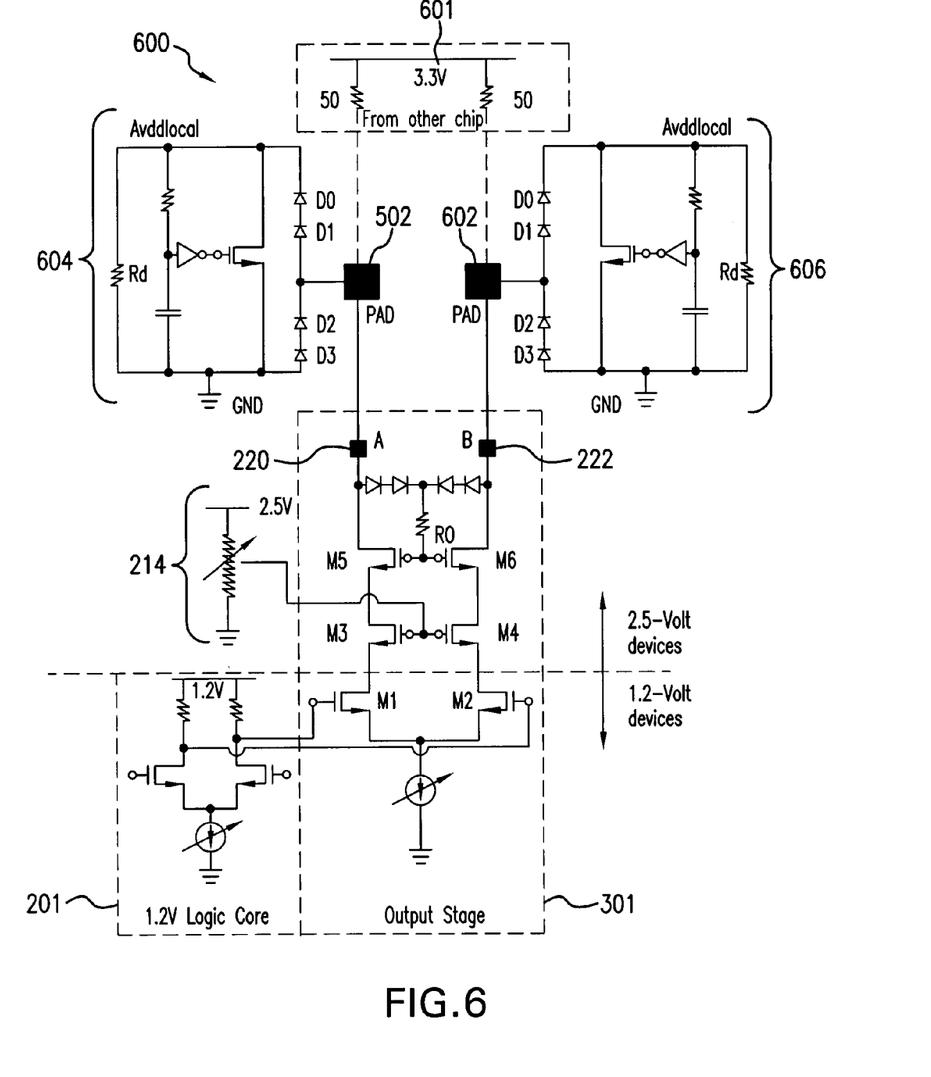
FIG. 6 illustrates a circuit diagram of an output stage protection system, in accordance with an embodiment of the present invention, which protects NMOS devices in an IC output stage during normal IC operations and IC power up/power down, and provides local ESD protection at the I/O pads.

I/O pad ESD protection system 500 can be implemented in conjunction with NMOS-based output stage protection system 300, shown in FIG. 3. For example, FIG. 6 illustrates a circuit diagram of an output stage protection system 600, in accordance with an embodiment of the present invention. Output stage protection system 600 protects NMOS devices in output stage 301 during normal IC operations, IC power up/power down, and ESD events on output nodes A 220 and B 222, as described in conjunction with FIGS. 2–3 above.

Output stage protection system 600 also provides local ESD protection at first and second I/O pads 502 and 602. Output stage 301 interfaces 1.2 V IC logic core 201 with an external 3.3 V supply voltage 601. A first I/O pad local ESD protection circuit 604 is coupled to first I/O pad 502, and a second I/O pad local ESD protection circuit 606 is coupled to second I/O pad 602. First and second I/O pad local ESD protection circuits 604 and 606 have the configuration of I/O pad ESD protection system 500, shown in FIG. 5. First and second I/O pad local ESD protection circuits 604 and 606 protect first and second I/O pads 502 and 602 from ESD events without exceeding the device voltage ratings of NMOS devices M1 204–M6 218 in output stage 301.

CONCLUSION

The present invention has been described above with the aid of functional building blocks illustrating the performance of specified functions and relationships thereof. The boundaries of these functional building blocks have been arbitrarily defined herein for the convenience of the description. Alternate boundaries can be defined so long as the specified functions and relationships thereof are appropriately performed. Any such alternate boundaries are thus within the scope and spirit of the claimed invention. One skilled in the art will recognize that these functional building blocks can be implemented by discrete components, application specific ICs, processors executing appropriate software and the like or any combination thereof.

While various embodiments of the present invention have been described above, it should be understood that they have been presented by way of example only, and not limitation. Thus, the breadth and scope of the present invention should not be limited by any of the above-described exemplary embodiments, but should be defined only in accordance with the following claims and their equivalents.

What is claimed is:

1. An integrated circuit (IC) output stage protection system, comprising:

a first NMOS device, having a gate configured to be coupled to an output of an IC logic core and a source coupled to a current source;

a second NMOS device, having a source coupled to a drain of said first NMOS device and a gate coupled to a biasing circuit that biases said second NMOS device so that said-first NMOS device operates in a saturation region; and one or more diodes coupled between an output node and a gate of a third NMOS device, having a source coupled to a drain of said second NMOS device and a drain coupled to said output node, wherein said one or more diodes substantially protect said NMOS devices so that they operate within a device voltage rating;

wherein an operating voltage of said first NMOS device is lower than an operating voltage of said second NMOS device, and wherein said operating voltage of said first NMOS device is lower than an operating voltage of said third NMOS device.

2. The IC output stage protection system of claim 1, wherein said one or more diodes are coupled to said gate of third NMOS device through a resistor.

3. The IC output stage protection system of claim 1, wherein at least one of said one or more diodes comprises an NMOS device configured as a diode, said NMOS device having a guard ring coupled to first and second contacts on a P-substrate.

4. The IC output stage protection system of claim 1, further comprising:
   an input/output (I/O) pad electrostatic discharge (ESD) protection circuit coupled to said output node.

5. The IC output stage protection system of claim 4, wherein said I/O pad ESD protection circuit comprises:
   a first set of one or more diodes coupled between an I/O pad and a local net;
   a second set of one or more diodes coupled between a ground and said I/O pad;
   an NMOS device having a drain coupled to said local net, a source coupled to said ground, and a gate coupled to an output of an inverter;
   a first resistor coupled between said local net and an input of said inverter;
   a capacitor coupled between said input of said inverter and said ground; and
   a second resistor coupled between said local net and said ground.

6. An integrated circuit (IC) output stage protection system, comprising:
   a first pair of NMOS devices, each having a gate configured to be coupled to respective IC logic core outputs and a source coupled to a current source;
   a second pair of NMOS devices, each having a source coupled to a respective drain of said first pair of NMOS devices and a gate coupled to a biasing circuit that biases said second pair so that said first pair of NMOS devices operate in a saturation region;
   a third pair of NMOS devices, each having a source coupled to a respective drain of said second pair of NMOS devices and a drain coupled to first and second output nodes, respectively;
   wherein an operating voltage of said first pair of NMOS devices is lower than an operating voltage of said second pair of NMOS devices and said operating voltage of said first pair of NMOS devices is lower than an operating voltage of said third pair of NMOS devices;
   a first set of one or more diodes coupled between said first output node and respective gates of said third pair of NMOS devices; and a second set of one or more diodes coupled between said second output node and said respective gates of said third pair of NMOS devices;

wherein said first and second sets of one or more diodes substantially protect said NMOS devices so that they operate within a device voltage rating.

7. The IC output stage protection system of claim 6, wherein said first and second sets of one or more diodes are coupled to said respective gates of said third pair of NMOS devices through a resistor.

8. The IC output stage protection system of claim 6, wherein:
   said first pair of NMOS devices comprises a pair of relatively thin oxide devices; and
   said second and third pairs of NMOS devices comprise a first and second pair of relatively thick oxide devices.

9. The IC output stage protection system of claim 6, wherein said first and second sets of one or more diodes each comprise two diodes.

10. The IC output stage protection system of claim 6, wherein at least one of said diodes comprises an NMOS device configured as a diode, said NMOS device having a guard ring coupled to first and second contacts on a P-substrate.

11. The IC output stage protection system of claim 6, further comprising:
    a first input/output (I/O) pad electrostatic discharge (ESD) protection circuit coupled to said first output node; and
    a second I/O pad ESD protection circuit coupled to said second output node.

12. The IC output stage protection system of claim 11, wherein said first and second I/O pad ESD protection circuits each comprise:
    a first set of one or more diodes coupled between an I/O pad and a local net;
    a second set of one or more diodes coupled between a ground and said I/O pad;
    an NMOS device having a drain coupled to said local net, a source coupled to said ground, and a gate coupled to an output of an inverter;
    a first resistor coupled between said local net and an input of said inverter;
    a capacitor coupled between said input of said inverter and said ground; and
    a second resistor coupled between said local net and said ground.

13. An integrated circuit (IC) output stage protection system, comprising:
    first and second input/output (I/O) pad electrostatic discharge (ESD) protection circuits coupled to respective first and second output nodes; and
    an output stage, including:
    first and second NMOS devices having respective gates configured to be coupled to first and second IC core outputs, respectively, and respective sources coupled to a current source,
    third and fourth NMOS devices having respective sources coupled to respective drains of said first and second NMOS devices and respective gates coupled to a biasing circuit,
    fifth and sixth NMOS devices having respective sources coupled to respective drains of said third and fourth NMOS devices and respective drains coupled to first and second output nodes, respectively,
    wherein an operating voltage of said first and second NMOS devices is lower than an operating voltage of said third and fourth NMOS devices and said operating voltage of said first and second NMOS devices is lower than an operating voltage of said fifth and sixth NMOS devices;

a first set of one or more diodes coupled between said first output node and respective gates of said fifth and sixth NMOS devices, and a second set of one or more diodes coupled between said second output node and said respective gates of said fifth and sixth NMOS devices;

wherein said output stage protection system substantially protects said NMOS devices so that they operate within a device voltage rating during IC power up/power down and ESD events.

14. The IC output stage protection system of claim 13, wherein said first and second sets of one or more diodes are coupled to said respective gates of said fifth and sixth NMOS devices through a resistor.

15. The IC output stage protection system of claim 13, wherein said first and second sets of one or more diodes each comprise two diodes.

16. The IC output stage protection system of claim 13, wherein at least one of said diodes comprises an NMOS device configured as a diode, said NMOS device having a guard ring coupled to first and second contacts on a P-substrate.

17. The IC output stage protection system of claim 13, wherein said first and second NMOS devices each comprise a 1.2 V device; and said third, fourth, fifth, and sixth NMOS devices each comprise a 2.5 V device.

18. The IC output stage protection system of claim 17, wherein a voltage difference between any two terminals of said first and second NMOS devices does not exceed approximately 1.32 V, and wherein a voltage difference between any two terminals of third, fourth, fifth, and sixth NMOS devices does not exceed approximately 2.75 V.

19. The IC output stage protection system of claim 17, wherein said biasing circuit biases said gates of said third and fourth NMOS devices so a drain voltage of said first and second NMOS devices does not exceed approximately 1.2 V.

20. The IC output stage protection system of claim 13, wherein said first and second I/O pad ESD protection circuits each comprise:

a first set of one or more diodes coupled between an I/O pad and a local net;

a second set of one or more diodes coupled between a ground and said I/O pad;

an NMOS device having a drain coupled to said local net, a source coupled to said ground, and a gate coupled to an output of an inverter;

a first resistor coupled between said local net and an input of said inverter;

a capacitor coupled between said input of said inverter and said ground; and a second resistor coupled between said local net and said ground.

* * * * *